United States Patent
Ma

(10) Patent No.: US 9,472,303 B2
(45) Date of Patent: Oct. 18, 2016

(54) SHIFT REGISTER, GATE DRIVING CIRCUIT, ARRAY SUBSTRATE AND DISPLAY DEVICE FOR ELIMINATING THE DRIFTING PHENOMENON OF OUTPUT SIGNAL

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/366,650

(22) PCT Filed: May 2, 2013

(86) PCT No.: PCT/CN2013/075072
§ 371 (c)(1),
(2) Date: Jun. 18, 2014

(87) PCT Pub. No.: WO2014/134862
PCT Pub. Date: Sep. 12, 2014

(65) Prior Publication Data
US 2015/0302933 A1 Oct. 22, 2015

(30) Foreign Application Priority Data

Mar. 6, 2013 (CN) .......................... 2013 1 0071435

(51) Int. Cl.
*G09G 3/36* (2006.01)
*G11C 19/18* (2006.01)
(Continued)

(52) U.S. Cl.
CPC ........... *G11C 19/184* (2013.01); *G09G 3/2096* (2013.01); *G09G 3/3677* (2013.01); *G11C 19/28* (2013.01); *H03K 17/063* (2013.01);
(Continued)

(58) Field of Classification Search
CPC .............................. G09G 3/3674; G11C 19/00
USPC .............................................. 345/100; 377/64
See application file for complete search history.

(56) References Cited

U.S. PATENT DOCUMENTS

2007/0103389 A1* 5/2007 Shin ..................... G09G 3/3275
345/36
2007/0258557 A1* 11/2007 Tseng ..................... G11C 19/28
377/64

(Continued)

OTHER PUBLICATIONS

International Preliminary Report on Patentability issued Sep. 8, 2015; PCT/CN2013/075072.

(Continued)

*Primary Examiner* — Adam J Snyder
(74) *Attorney, Agent, or Firm* — Ladas & Parry LLP

(57) ABSTRACT

Embodiments of the present disclosure disclose a shift register, a gate driving circuit, an array substrate and a display apparatus capable of effectively eliminating a drifting phenomenon of an output signal and increasing an output stability of the shift register. The shift register comprises input terminals of the shift register comprising a start signal input terminal, a first clock signal input terminal and a second clock signal input terminal; a pre-charging circuit which is in response to a start signal and a first clock signal; a first pulling-up circuit which is in response to an enable level of the start signal and an enable level of the first clock signal; a pulling-down circuit which is in response to a disable level of the first clock signal and an enable level of the second clock signal; a second pulling-up circuit; and an output terminal of the shift register.

20 Claims, 6 Drawing Sheets

(51) Int. Cl.
   *G11C 19/28*   (2006.01)
   *G09G 3/20*   (2006.01)
   *H03K 17/06*   (2006.01)
   *H03K 17/687*   (2006.01)
   *G11C 19/00*   (2006.01)

(52) U.S. Cl.
   CPC .. *H03K17/6871* (2013.01); *G09G 2310/0248* (2013.01); *G09G 2310/0286* (2013.01); *G09G 2320/045* (2013.01)

(56) References Cited

U.S. PATENT DOCUMENTS

| | | |
|---|---|---|
| 2010/0150303 A1 | 6/2010 | Tsai et al. |
| 2010/0177068 A1 | 7/2010 | Shih et al. |
| 2010/0245307 A1* | 9/2010 | Kimura ............... G09G 3/3688 345/92 |
| 2010/0245335 A1* | 9/2010 | Kimura ............... G09G 3/3677 345/90 |
| 2011/0041020 A1* | 2/2011 | Liu ............... G01R 31/318552 714/731 |
| 2012/0293401 A1 | 11/2012 | Li et al. |
| 2015/0155052 A1* | 6/2015 | Ma ........................ G09G 3/36 345/100 |

OTHER PUBLICATIONS

Korean Notice of Allowance dated May 30, 2016; Appln. No. 10-2014-7017868.

* cited by examiner

SHIFT REGISTER, GATE DRIVING CIRCUIT, ARRAY SUBSTRATE AND DISPLAY DEVICE FOR ELIMINATING THE DRIFTING PHENOMENON OF OUTPUT SIGNAL

CROSS REFERENCE TO RELATED APPLICATIONS

This application is based on International Application No. PCT/CN2013/075072 filed on May 2, 2013, which claims priority to Chinese National Application No. 201310071435.0 filed on Mar. 6, 2013. The entire contents of each and every foregoing application are incorporated herein by reference.

TECHNICAL FIELD

The present disclosure relates to a field of display device, and particularly to a shift register, a gate driving circuit, an array substrate and a display device.

BACKGROUND

Currently, display device are becoming thinner, lighter, higher in resolution, narrower in frame and more energy-saving, therefore it is necessary to integrate more switching elements and smaller pixels into a limited space to meet requirements of the display devices. In order to avoid increasing processing steps and a manufacture cost, generally a Gate Driver on Array (GOA) technology is employed to integrate gate driving units on an array substrate to form GOA units. In the GOA, as a gate driving technique, usually shift registers are used to implement a scan driving.

During implementing the above-described scan driving, the inventor found that the prior art has at least the following problem. For example, the shift register with a structure illustrated in FIG. 1 comprises first to six thin film transistors M1' to M6', which are all P-type thin film transistors, and a first capacitor CF, and an enable level of the thin film transistors is a low level (The enable level of the thin film transistor refers to a level at which the thin film transistor is turned on. For example, the low level may control the P-type thin film transistor to turn on, so the enable level of the P-type thin film transistor is the low level; and a high level may control the P-type thin film transistor to turn off, so a disable level of the P-type thin film transistor is the high level). As illustrated in FIG. 2, during a first phase T1, the low level is inputted to a first node A' and the high level is inputted to a third node C'; during a second phase T2, the high level is inputted to the first node A' and the third node C'; during a third phase T3, the low level is inputted to the first node A' while the third node C' is floated and maintains at the high level; and during a fourth phase T4, the first node A' is floated and maintains at the low level, meanwhile the fifth thin film transistor M5' is turned on so that a potential remaining at the third node C' interferes with the first node A', which in turn may affect an on state of the sixth thin film transistor M6', causing the shift register to have a drifting phenomenon at a pulling-up voltage, and resulting in unstable output signals and in turn leading to unreliability in operations of the shift register.

SUMMARY

Embodiments of the present disclosure provide a shift register, a gate driving circuit, an array substrate and a display apparatus, which can effectively eliminate a drifting phenomenon of the output signal and increase an operating stability of the shift register.

In order to resolve the above-described technical problems, the embodiments of the present disclosure employ the following technical solutions.

A shift register, comprising:

input terminals of the shift register, comprising a start signal input terminal, a first clock signal input terminal and a second clock signal input terminal;

a pre-charging circuit for outputting a first turn-on voltage and a second turn-on voltage in response to a start signal and a first clock signal;

a first pulling-up circuit for outputting a high level in response to an enable level of the start signal and an enable level of the first clock signal under a control of the first turn-on voltage;

a pulling-down circuit for outputting a low level in response to a disable level of the start signal, a disable level of the first clock signal and an enable level of a second clock signal under a control of the second turn-on voltage;

a second pulling-up circuit for outputting the high level when the second turn-on voltage is at a disable level; and an output terminal of the shift register, connected to output terminals of the first pulling-up circuit, the pulling-down circuit and the second pulling-up circuit, for outputting a voltage signal.

Furthermore, the second pulling-up circuit comprises a reverse circuit and a pulling-up sub circuit, wherein, the reverse circuit outputs the high level when the second turn-on voltage is at the enable level, and outputs the low level when the second turn-on voltage is at the disable level;

the pulling-up sub circuit outputs the high level in response to the low level outputted from the reverse circuit.

Furthermore, the pre-charging circuit comprises a first thin film transistor, a second thin film transistor, a first node, a second node and a first capacitor, wherein, a gate of the first thin film transistor is connected to the first clock signal input terminal, a source thereof is connected to the start signal input terminal, and a drain thereof is connected to the second node;

a gate of the second thin film transistor is connected to the second node, a source thereof is connected to the start signal input terminal and a drain thereof is connected to the first node;

the first node is for outputting the first turn-on voltage of the pre-charging circuit;

the second node is for outputting the second turn-on voltage of the pre-charging circuit; and one terminal of the first capacitor is connected to the second node and the other terminal thereof is connected to the output terminal of the shift register.

Furthermore, the first pulling-up circuit comprises a third thin film transistor, a gate thereof is connected to the first node, a source thereof is connected to a high voltage, and a drain thereof is connected to the output terminal of the shift register.

Furthermore, the pulling-down circuit comprises a fourth thin film transistor, a gate thereof is connected to the second node, a source thereof is connected to the second clock signal input terminal, and a drain thereof is connected to the output terminal of the shift register.

Furthermore, the reverse circuit comprises fifth to seventh thin film transistors and a third node, wherein, a gate of the fifth thin film transistor is connected to the second node, a source thereof is connected to the high voltage, and a drain thereof is connected to the third node;

a gate of the sixth thin film transistor is connected to a source of the seventh thin film transistor, a source thereof is connected to a low voltage and a drain thereof is connected to the third node;

a gate of the seventh thin film transistor is connected to the low voltage, the source thereof is connected to the gate of the sixth thin film transistor and a drain thereof is connected to the low voltage; and the third node is an output terminal of the reverse circuit.

Furthermore, the pulling-up sub circuit comprises: an eighth thin film transistor, a gate thereof is connected to the third node, a source thereof is connected to the high voltage and a drain thereof is connected to the output terminal of the shift register.

A gate driving circuit comprises the above-described shift register.

An array substrate comprises the above-described gate driving circuit.

A display apparatus comprises the above-described array substrate.

The embodiments of the present disclosure provide a shift register, a gate driving circuit, a array substrate and a display apparatus which may avoid a case in which a plurality of floating nodes interfere with each other and characteristics of the output terminal is affected, effectively eliminate the drifting phenomenon of the output signal and improve the operating stability of the shift register.

BRIEF DESCRIPTION OF THE DRAWINGS

In order to describe the embodiments of the present disclosure or technical solutions of the prior art more clearly, drawings that are required for describing the embodiments or the prior art are described briefly below. It is apparent that the drawings described below represent merely some of the embodiments of the present disclosure, and on the basis of these drawings, those ordinary skilled in the related art can obtain other drawings without paying creative efforts.

DETAILED DESCRIPTION

Thereafter, solutions of embodiments of the present disclosure will be described clearly and completely in connection with drawings of the embodiments of the present disclosure, but obviously the described embodiments are only some, but not all of the embodiments of the present disclosure. Any other embodiments obtained by those ordinary skilled in the art based on the embodiments of the present disclosure without inventive labors should fall into a scope sought for protection in the present disclosure.

Figure 1:
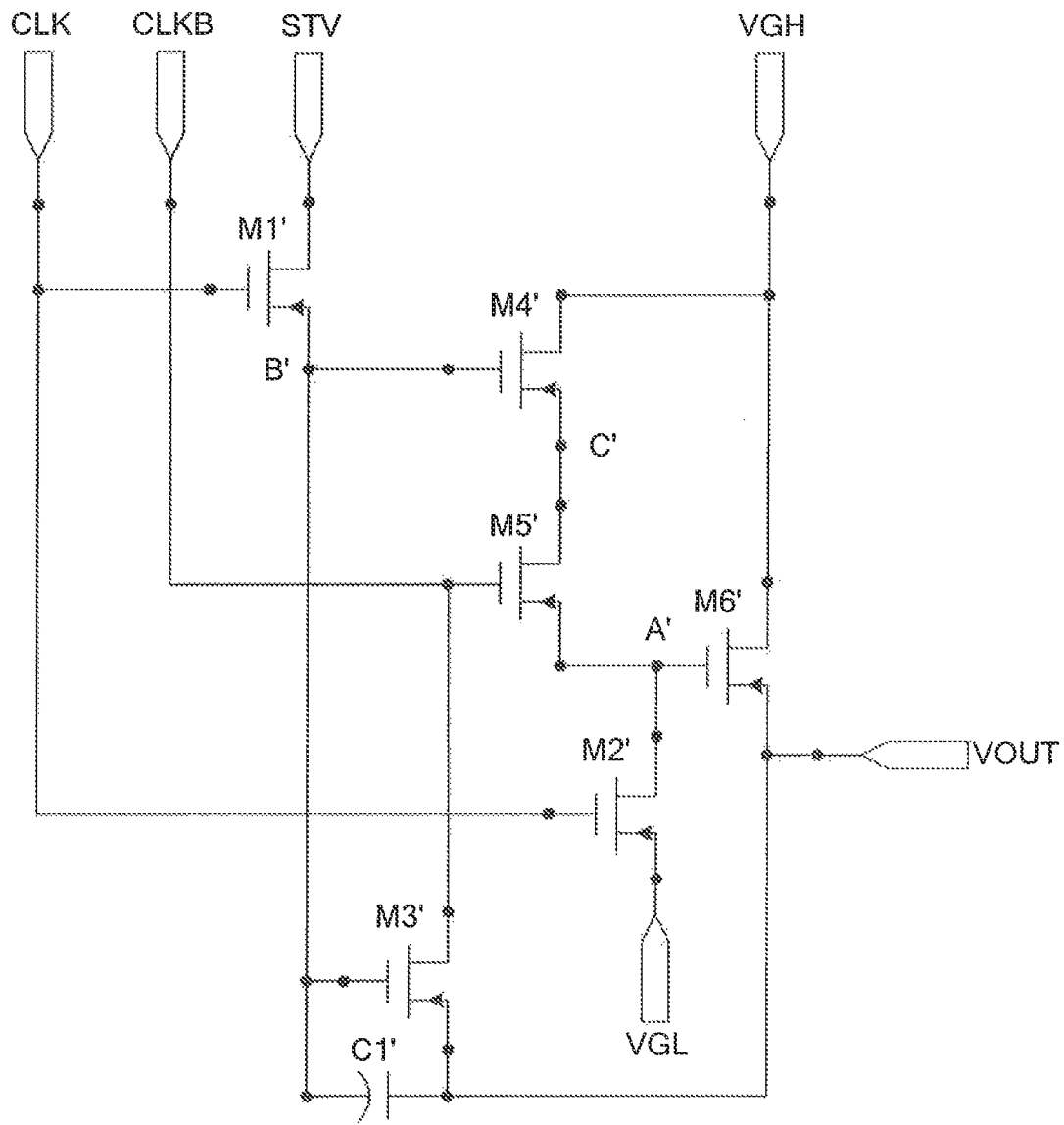
FIG. 1 is a circuit diagram for a shift register according to the prior art.
Figure 2:
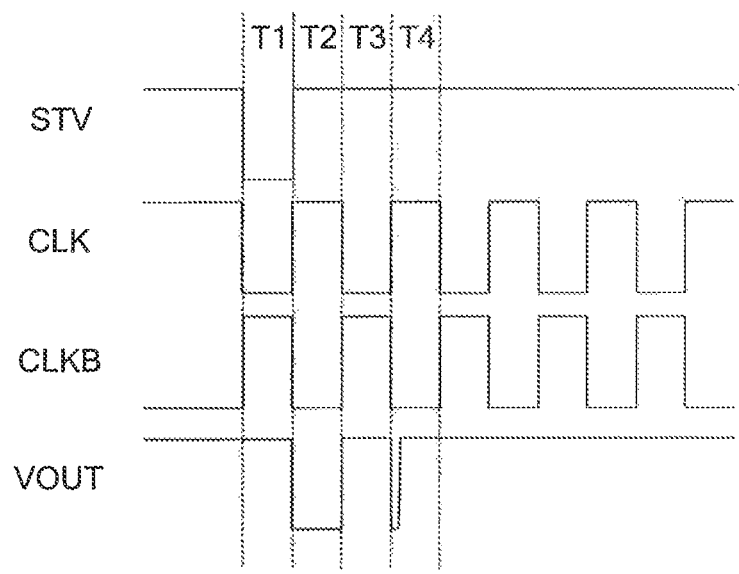
FIG. 2 is a timing waveform for the shift register according to the prior art.
Figure 3:
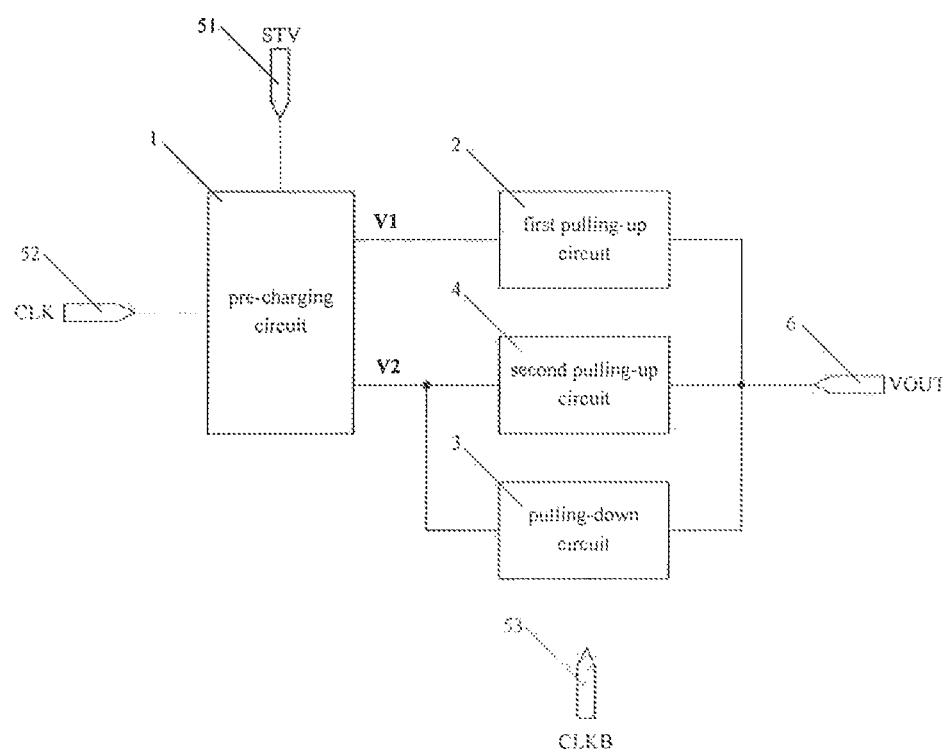
FIG. 3 is a structural block diagram for a shift register according to an embodiment of the present disclosure.

As illustrated in FIG. 3, an embodiment of the present disclosure provides a shift register comprising input terminals of the shift register, a pre-charging circuit 1, a first pulling-up circuit 2, a pulling-down circuit 3, a second pulling-up circuit 4 and an output terminal 6 of the shift register.

In an example, the input terminals of the shift register comprise a start signal input terminal 51, a first clock signal input terminal 52 and a second clock signal input terminal 53.

The pre-charging circuit 1 outputs a first turn-on voltage V1 and a second turn-on voltage V2 in response to a start signal STV and a first clock signal CLK. It shall be noted that, although both the first turn-on voltage V1 and the second turn-on voltage V2 respond to the start signal STV and the first clock signal CLK, they are different in that the first turn-on voltage V1 controls the first pulling-up circuit 2 while the second turn on voltage V2 controls the pulling-down circuit 3 and the second pulling-up circuit 4.

The first pulling-up circuit 2 outputs a high level in response to an enable level of the start signal STV and an enable level of the first clock signal CLK under a control of the first turn-on voltage V1.

The pulling-down circuit 3 outputs a low level in response to a disable level of the start signal STV, a disable level of the first clock signal CLK and an enable level of a second clock signal CLKB under a control of the second turn-on voltage V2.

The second pulling-up circuit 4 outputs the high level when the second turn-on voltage V2 is at a disable level.

The output terminal 6 of the shift register is connected to an output terminal of the first pulling-up circuit 2, an output terminal of the pulling-down circuit 3 and an output terminal of the second pulling-up circuit 4, and outputs a voltage signal VOUT.

In a further embodiment of the present disclosure, the second pulling-up circuit 4 comprises a reverse circuit 401 and a pulling-up sub circuit 402, wherein, the reverse circuit 401 outputs the high level when the second turn-on voltage V2 is at the enable level, and outputs the low level when the second turn-on voltage V2 is at the disable level; and The pulling-up sub circuit 402 outputs the high level in response to the low level outputted from the reverse circuit.

Below the shift register of the present disclosure will be described in more detail in conjunction with particular embodiments. In the embodiments below, as an example, the thin film transistors are described as P-type thin film transistor, the enable level is a low level and the disable level is a high level. However, it shall be noted that the enable level of the thin film transistor refers to a level at which the thin film transistor is turned on. Taking the P-type thin film transistor as an example, the low level may control the P-type thin film transistor to turn on, so the enable level of the P-type thin film transistor is the low level; while the high level may control the P-type thin film transistor to turn off, so the disable level of the P-type thin film transistor is the high level. Therefore, a case in which the first turn-on voltage is the enable level corresponds to a case in which the thin film transistor controlled by the first turn on voltage V1 is turned on, and a case in which the first turn-on voltage is the disable level corresponds to a case in which the thin film transistor controlled by the first turn-on voltage V1 is turned off. Similarly, a case in which the second turn-on voltage is the enable level corresponds to a case in which the thin film transistor controlled by the second turn on voltage V2 is turned on, and a case in which the second turn-on voltage is the disable level corresponds to a case in which the thin film transistor controlled by the second turn-on voltage V2 is turned off.

Figure 4:
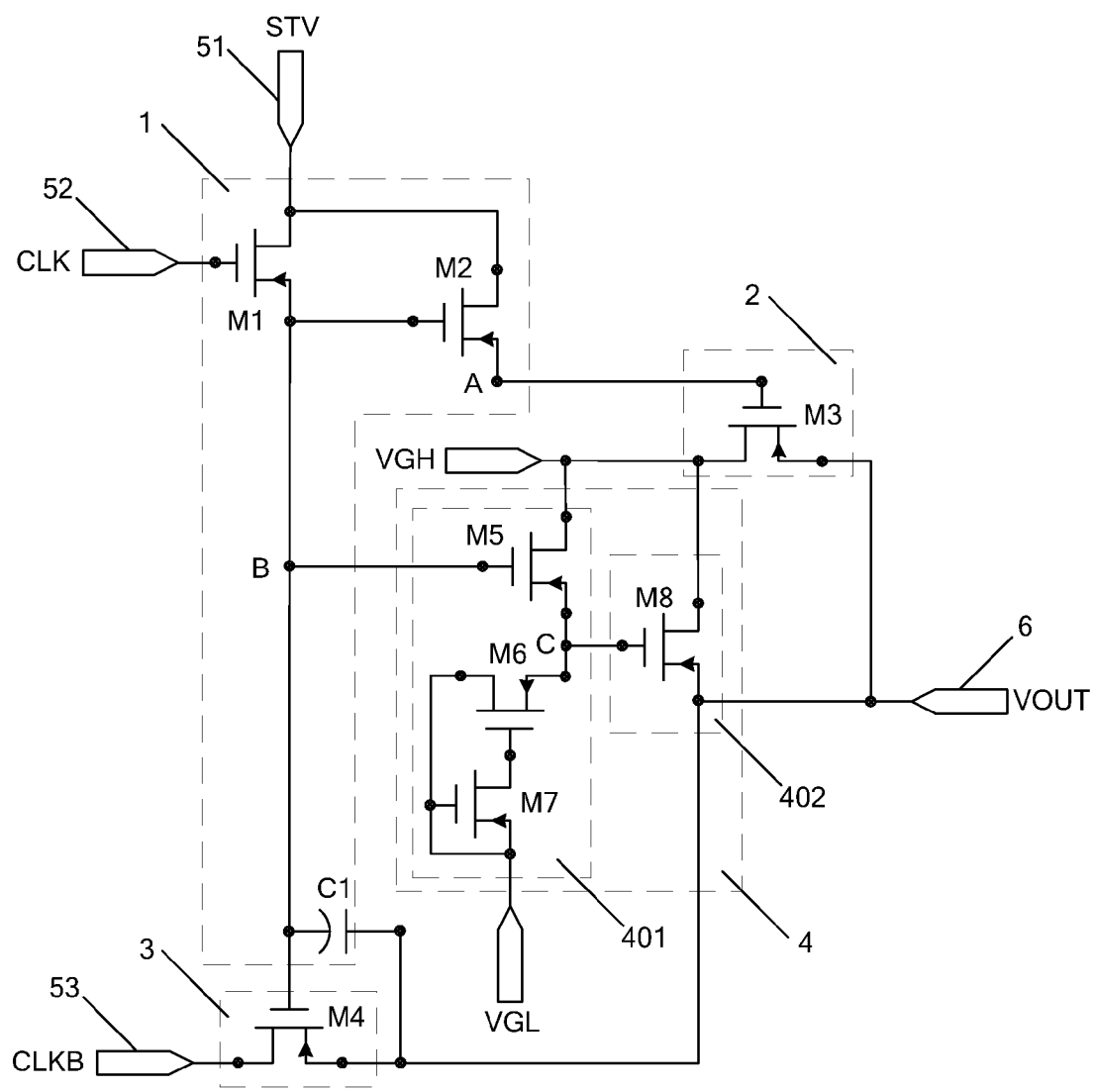
FIG. 4 is an exemplary circuit diagram for the shift register according to the embodiment of the present disclosure.

FIG. 4 illustrates a particular embodiment of the shift register according to the present disclosure, and as illustrated in FIG. 4, the switching transistors M1-M8 in this embodiment are all thin film transistors (TFTs). As illustrated in the figure, the pre-charging circuit 1 comprises a first thin film transistor M1, a second thin film transistor M2, a first node A, a second node B and a first capacitor C1. In an example, a gate of the first thin film transistor M1 is connected to a first clock signal input terminal 52 and is for receiving a first clock signal CLK, a source thereof is connected to a start signal input terminal 51 and a drain thereof is connected to the second node B. It shall be noted that the source of the first thin film transistor M1 is connected to the start signal input terminal 51 and is for receiving the start signal STV. Actually, the source of the first thin film transistor M1 may also be connected to an output terminal of a corresponding previous stage of shift register to receive a voltage signal outputted from the previous stage of shift register as the start signal. A gate of the second thin film transistor M2 is connected to the second node B, a source thereof is connected to the start signal input terminal 51, and a drain thereof is connected to the first node A. The first node A is for outputting a first turn-on voltage V1 of the pre-charging circuit. The second node B is for outputting a second turn-on voltage V2 of the pre-charging circuit. One terminal of the first capacitor C1 is connected to the second node B, and the other terminal thereof is connected to the output terminal 6 of the shift register.

The first pulling-up circuit 2 comprises a third thin film transistor M3, a gate thereof is connected to the first node A, a source thereof is connected to a high voltage VGH, and a drain thereof is connected to the output terminal 6 of the shift register.

The pulling-down circuit 3 comprises a fourth thin film transistor M4, a gate thereof is connected to the second node B, a source thereof is connected to a second clock signal input terminal 53 and is for receiving a second clock signal CLKB, and a drain thereof is connected to the output terminal 6 of the shift register.

The reverse circuit 401 comprises a fifth thin film transistor M5, a sixth thin film transistor M6, a seventh thin film transistor M7 and a third node C, wherein a gate of the fifth thin film transistor M5 is connected to the second node B, a source thereof is connected to the high voltage VGH, and a drain thereof is connected to the third node C; a gate of the sixth thin film transistor M6 is connected to a source of the seventh thin film transistor M7, a source thereof is connected to a low voltage VGL, and a drain thereof is connected to the third node C; a gate of the seventh thin film transistor M7 is connected to the low voltage VGL, the source thereof is connected to the gate of the sixth thin film transistor M6, and a drain thereof is connected to the low voltage VGL; and the third node C is an output terminal of the reverse circuit 401.

The pulling-up sub circuit 402 comprises an eighth thin film transistor M8, a gate thereof is connected to the third node C, a source thereof is connected to the high voltage VGH, and a drain thereof is connected to the output terminal 6 of the shift register.

Figure 5:
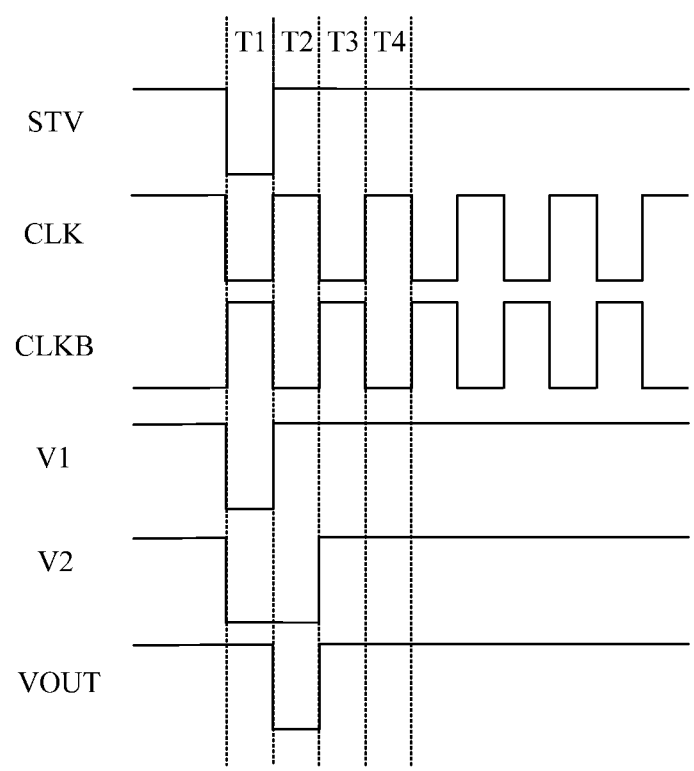
FIG. 5 is a timing waveform for the shift register according to the embodiment of the present disclosure.

Referring to FIG. 5, FIG. 5 is a timing waveform for the shift register according to the present embodiment. The above-described shift register operates with the first and second clock signals CLK and CLKB which are inputted differentially, i.e., the first and second clock signals CLK and CLKB are signals inputted differentially. Therefore, when the first clock signal CLK is at the high level, the second clock signal CLKB is at the low level, and when the first clock signal CLK is at the low level, the second clock signal CLKB is at the high level.

During a first phase T1, the start signal STV outputs the low level, the first clock signal CLK outputs the low level, and the second clock signal CLKB outputs the high level. At this time, the first thin film transistor M1 is turned on, the second turn-on voltage V2 outputted from the second node B is at the low level and meanwhile the first capacitor C1 starts to be charged, the second thin film transistor M2 is turned on, and the first turn-on voltage V1 outputted from the first node A is at the low level. When the first turn-on voltage V1 outputted from the first node A is at the low level, the third thin film transistor M3 is turned on, thereby the high voltage VGH pulls up an output of the third thin film transistor M3 so that the third thin film transistor M3 outputs the high level, and at this point the VOUT outputted from the output terminal 6 of the shift register is at the high level. When the second turn-on voltage V2 outputted from the second node B is at the low level, the fourth thin film transistor M4 is turned on, and because the second clock signal CLKB also outputs the high level, the VOUT outputted from the output terminal 6 of the shift register is still at the high level. In addition, the fifth thin film transistor M5 is turned on, the sixth thin film transistor M6 is turned off, the third node C outputs the high level, and the eighth thin film transistor M8 is turned off.

During a second phase T2, the start signal STV outputs the high level, the first clock signal CLK outputs the high level, and the second clock signal CLKB outputs the low level. At this time the first thin film transistor M1 is turned off, meanwhile the first capacitor C1 starts to discharge and the second turn-on voltage V2 outputted from the second node B maintains to be at the low level until the discharging of the first capacitor C1 is finished. Actually, the discharging of the first capacitor C1 will continue until a next charging process starts, therefore the second turn-on voltage V2 outputted from second node B will maintain to be at the low level during the second phase T2. When the second turn-on voltage V2 outputted from second node B is at the low level, the second thin film transistor M2 is turned on, and the first turn-on voltage V1 outputted from the first node A is at the high level. When the first turn-on voltage V1 outputted from the first node A is at the high level, the third thin film transistor M3 is turned off. When the second turn-on voltage V2 outputted from second node B is at the low level, the fifth thin film transistor M5 is turned on, the sixth thin film transistor M6 is turned off, the seventh thin film transistor M7 is turned off, the third node C outputs the high level, and the eighth thin film transistor M8 is turned off. And when the second turn-on voltage V2 outputted from second node B is at the low level, the fourth thin film transistor M4 is turned on, thereby the second clock signal CLKB pulls down an output of the fourth thin film transistor M4 so that the fourth thin film transistor M4 outputs the low level, therefore the VOUT outputted from the output terminal 6 of the shift register is at the low level.

During a third phase T3, the start signal STV outputs the high level, the first clock signal CLK outputs the low level, and the second clock signal CLKB outputs the high level. At this time the first thin film transistor M1 is turned on, the second turn-on voltage V2 outputted from second node B is at the high level, and meanwhile the first capacitor C1 starts to be charged; the second thin film transistor M2 is turned off, and at this point the first node A becomes a floating node. Here a floating node means that a state of the node is not controlled by a voltage inputted at the current point of time but by a voltage remained at the node at a previous point of time. Therefore, the first node A is the floating node, and the first turn-on voltage V1 remained and outputted is still at the high level. When the first turn-on voltage V1 outputted from the first node A is at the high level, the third thin film transistor M3 is turned off. When the second turn-on voltage V2 outputted from second node B is at the high level, the fourth thin film transistor M4 is turned off, the fifth thin film transistor M5 is turned off, the sixth thin film transistor M6 is turned on, the seventh thin film transistor M7 is turned on, the third node C outputs the low level, the eighth thin film transistor M8 is turned on, and therefore the high voltage VGH pulls up an output of the eighth thin film transistor M8 so that the eighth thin film transistor M8 outputs the high level, and at this point the VOUT outputted from the output terminal 6 of the shift register is at the high level.

During a fourth phase T4, the start signal STV outputs the high level, the first clock signal CLK outputs the high level, and the second clock signal CLKB outputs the low level. At this time the first thin film transistor M1 is turned off, meanwhile the first capacitor C1 starts to discharge, and the second turn-on voltage V2 outputted from the second node B maintains to be at the low level until the discharging of the first capacitor C1 is finished. Actually, the discharging of the first capacitor C1 will continue until the next charging process starts, therefore the second turn-on voltage V2 outputted from the second node B will maintain to be at the high level during the fourth phase T4. When the second turn-on voltage V2 outputted from second node B is at the high level, the second thin film transistor M2 is turned off, and at this time the first node A is still the floating node. Therefore, the first node A is the floating node, so the first turn-on voltage V1 remained and outputted is still at the high level. When the first turn-on voltage V1 outputted from the first node A is at the high level, the third thin film transistor M3 is turned off. When the second turn-on voltage V2 outputted from second node B is at the high level, the fourth thin film transistor M4 is turned off, the fifth thin film transistor M5 is turned off, the sixth thin film transistor M6 is turned on, the seventh thin film transistor M7 is turned on, the third node C outputs the low level, the eighth thin film transistor M8 is turned on, and therefore the high voltage VGH pulls up the output of the eighth thin film transistor M8 so that the eighth thin film transistor M8 outputs the high level, and at this point the VOUT outputted from the output terminal 6 of the shift register is at the high level.

So far in the particular embodiment of the present disclosure, the second node B of the shift register outputs the second turn-on voltage V2 with the high level all the time starting from the third phase T3, so that the fifth thin film transistor M5 is turned off, the sixth thin film transistor M6 is turned on, the seventh thin film transistor M7 is turned on, and the eighth thin film transistor M8 is turned on so as to enable the pulling up, thus the output terminal 6 of the shift register outputs the VOUT with the high level. Thus, the case in which the plurality of floating nodes interfere with each other and affect the output signal is avoided, and the operation stability of the shift register is improved.

In addition, changes in the first turn-on voltage V1 outputted from the first node A and the second turn-on voltage V2 outputted from second node B during the first stage T1~the fourth stage T4 can be acquired from the above analysis, as illustrated in FIG. 5.

In addition, it shall be noted that, during subsequent periods of time, i.e., during periods that follow the fourth phase T4, because the second turn-on voltage V2 outputted from second node B is at the high level all along (comprising when the first capacitor C1 charges the second node B and discharges the second node B), the fifth thin film transistor M5 is turned off, the sixth thin film transistor M6 is turned on, the seventh thin film transistor M7 is turned on and the eighth thin film transistor M8 is turned on so that an output level of the output terminal 6 of the shift register is pulled up, making the output terminal 6 of the shift register output the VOUT with the high level, and accordingly the stability of outputting of the VOUT with the high level from the output terminal 6 of the shift register is ensured.

Therefore, we can see from the above analysis of the changing process of the signals that the stages T1-T4 correspond to a complete cycle of signal changing. After the stage T4, the VOUT outputted from the output terminal 6 of the shift register maintains to be at the high level no matter how the first clock signal CLK and the second clock signal CLKB change, as long as the start signal STV at the low level is not inputted. And when the start signal STV at the low level is inputted again, the shift register according to the embodiment of the present disclosure repeats the operation timing changing cycle during the first phase T1 to the fourth phase T4 as described above.

The shift register provided by the embodiment of the present disclosure can avoid the case in which the plurality of floating nodes interfere with each other and affect the characteristics at the output terminal, can effectively eliminate the drift phenomenon of the output signal, and can increase the output stability of the shift register.

Figure 6:
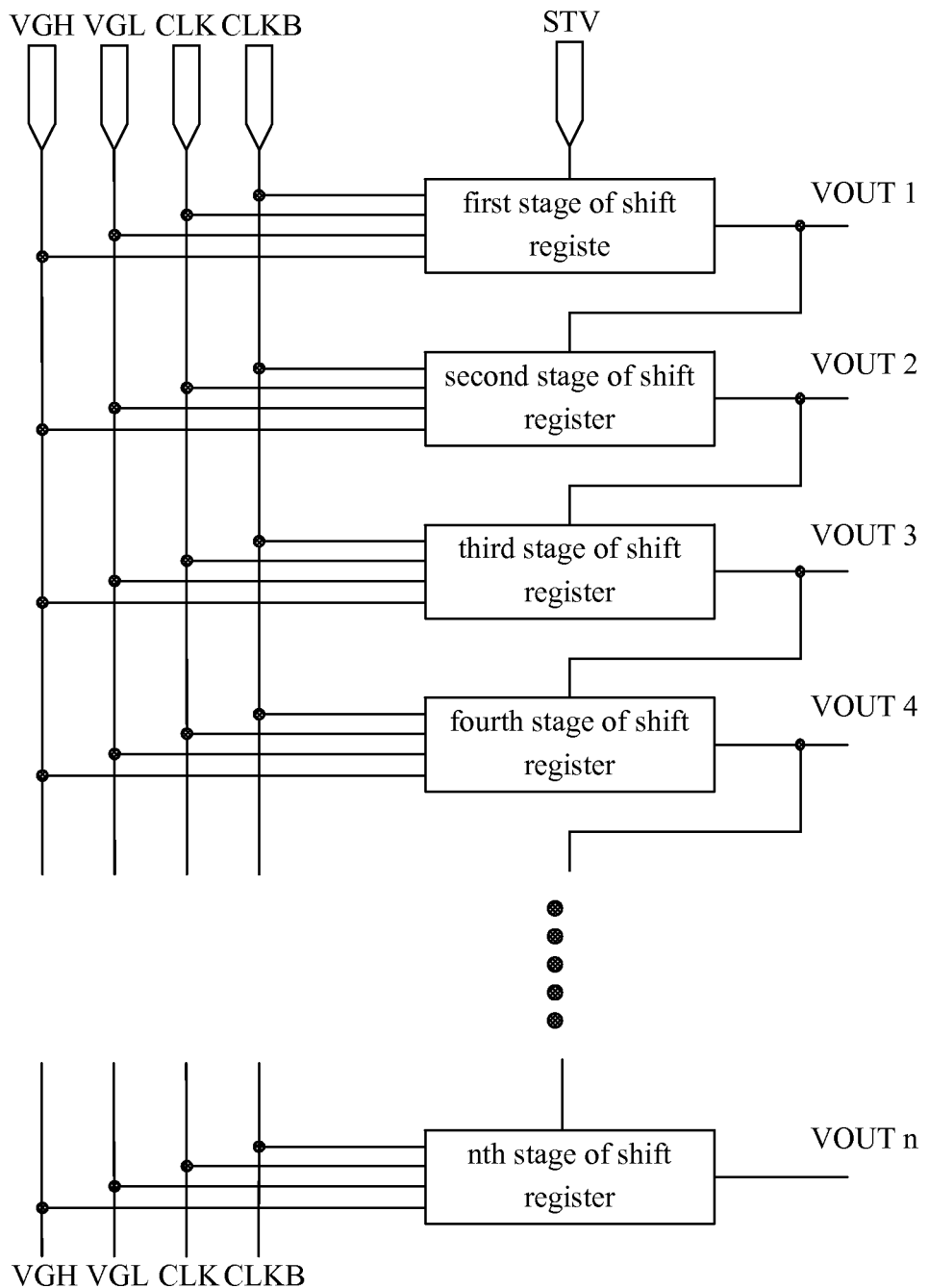
FIG. 6 is an exemplary structural diagram for a gate driving circuit according to an embodiment of the present disclosure.

In addition, an embodiment of the present disclosure further provides a gate driving circuit which comprises the shift register of the embodiment described above. As illustrated in FIG. 6, the gate driving circuit comprises a plurality of stages of shift registers, including a first stage to a nth stage of the shift registers, and the respective stages of the shift registers connect in cascade and output VOUT1 to VOUTn, respectively for generating scanning signals. Each stage of the shift register receives the first clock signal CLK, the second clock signal CLKB and the start signal, and outputs a scanning signal. Among the plurality of stages of the shift registers, the first stage of the shift register receives the start signal STV, and the remaining stages of the shift registers receive the scanning signal outputted from a corresponding previous stage of the shift register as the start signal respectively. Each stage of the shift register employs the shift register having the circuit structure above-described.

It shall be noted that, with respect to any stage of the shift register except for the first stage of the shift register, the sources of the first and second thin film transistors M1 and M2 of the pre-charging circuit in this stage of the shift register are not connected to the start signal STV but to the VOUT outputted from the output terminal of a corresponding previous stage of the shift register, and the structure of other parts of the shift register are not changed. Therefore, its operation principle and circuit structure are the same as the shift register according to the above-described embodiment, and so the description thereof is omitted here.

An operation process of the gate driving circuit is described as follows:

the first stage of the first shift register receives the start signal STV, the first clock signal CLK and the second clock signal CLKB, and outputs a first scanning signal VOUT1;

the second stage of the second shift register receives first scanning signal VOUT1 as the start signal, the second clock signal CLK and the second clock signal CLKB, and outputs a second scanning signal VOUT2; and so forth until the nth stage of the nth shift register outputs the nth scanning signal VOUTn.

Figure 7:
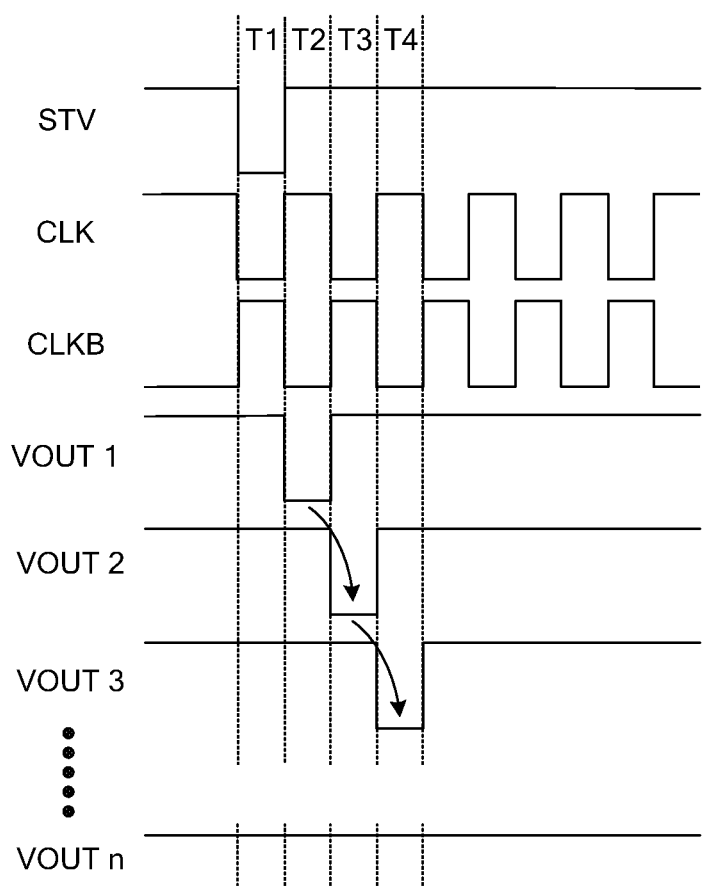
FIG. 7 is a timing waveform for the gate driving circuit according to the embodiment of the present disclosure.

As illustrated in FIG. 7, the gate driving circuit operates under the control of the first clock signal CLK and the second clock signal CLKB, and outputs the first to the nth scanning signals VOUT1 to VOUTn progressively from top to bottom.

The gate driving circuit provided by the embodiment of the present disclosure can avoid the case, occurred in the shift registers included therein, in which the plurality of floating nodes interfere with each other and affect the characteristics at the output terminal, can effectively eliminate the drift phenomenon of the output signal, and can increase the output stability of the shift register.

In addition, an embodiment of the present disclosure further provides an array substrate which comprises the gate driving circuit according to the embodiment described above. The gate driving circuit in the array substrate is the same as the one according to the embodiment described above, thus detailed description thereof is omitted here. And structures of other portions of the array substrate may be learnt from the prior art, thus detailed description thereof is omitted herein.

The array substrate provided by the embodiment of the present disclosure can avoid the case, occurred in the shift registers included therein, in which the plurality of floating nodes interfere with each other and affect the characteristics at the output terminal, can effectively eliminate the drift phenomenon of the output signal, and can increase the output stability of the shift register.

In addition, an embodiment of the present disclosure further provides a display apparatus which comprises the array substrate according to the embodiment described above. The array substrate in the display apparatus is the same as the one according to the embodiment described above, thus detailed description thereof is omitted here. And structures of other portions of the display apparatus may be learnt from the prior art, thus detailed description thereof is omitted herein.

The display apparatus provided by the embodiment of the present disclosure can the case, occurred in the shift registers included therein, in which the plurality of floating nodes interfere with each other and affect the characteristics at the output terminal, can effectively eliminate the drift phenomenon of the output signal, and can increase the output stability of the shift register.

It may understand that above implementations are only illustrative implementations utilized for explaining the principle of the present disclosure; however, the present disclosure is not limited thereto. For those ordinary skilled in the art, many variations or improvements may be made without departing from the spirit and essence of the present disclosure, and such variations and improvements fall into the protection scope of the present disclosure.

What is claimed is:

1. A shift register, comprising:
   input terminals of the shift register, comprising a start signal input terminal, a first clock signal input terminal and a second clock signal input terminal;
   a pre-charging circuit connected to the start signal input terminal to receive a start signal and connected to the first clock signal input terminal to receive a first clock signal, for outputting a first turn-on voltage and a second turn-on voltage in response to the start signal and the first clock signal;
   a first pulling-up circuit connected to a first turn-on voltage outputting terminal of the pre-charging circuit to receive the first turn-on voltage and connected to a external high voltage to receive the external high voltage, for outputting a high level in response to an enable level of the start signal and an enable level of the first clock signal under a control of the first turn-on voltage;
   a pulling-down circuit connected to the second clock signal input terminal to receive a second clock signal and connected to a second turn-on voltage outputting terminal of the pre-charging circuit to receive the second turn-on voltage, for outputting a low level in response to a disable level of the start signal, a disable level of the first clock signal and an enable level of a second clock signal under a control of the second turn-on voltage;
   a second pulling-up circuit connected to the second turn-on voltage outputting terminal of the pre-charging circuit to receive the second turn-on voltage and connected to the external high voltage to receive the external high voltage, for outputting the high level when the second turn-on voltage is at a disable level; and
   an output terminal of the shift register, connected to an output terminal of the first pulling-up circuit, an output terminal of the pulling-down circuit and an output terminal of the second pulling-up circuit, for outputting a voltage signal.

2. The shift register of claim 1, wherein the second pulling-up circuit comprises a reverse circuit and a pulling-up sub circuit, wherein,
   the reverse circuit outputs the high level when the second turn-on voltage is at the enable level, and outputs the low level when the second turn-on voltage is at the disable level; and
   the pulling-up sub circuit outputs the high level in response to the low level outputted from the reverse circuit.

3. The shift register of claim 2, wherein the reverse circuit comprises fifth to seventh thin film transistors and a third node, wherein,
   a gate of the fifth thin film transistor is connected to the second node, a source thereof is connected to the high voltage, and a drain thereof is connected to the third node;
   a gate of the sixth thin film transistor is connected to a source of the seventh thin film transistor, a source thereof is connected to a low voltage and a drain thereof is connected to the third node;
   a gate of the seventh thin film transistor is connected to the low voltage, the source thereof is connected to the gate of the sixth thin film transistor and a drain thereof is connected to the low voltage; and
   the third node is an output terminal of the reverse circuit.

4. The shift register of claim 3, wherein the pulling-up sub circuit comprises: an eighth thin film transistor, a gate thereof is connected to the third node, a source thereof is connected to the high voltage and a drain thereof is connected to the output terminal of the shift register.

5. The shift register of claim 1, wherein the pre-charging circuit comprises a first thin film transistor, a second thin film transistor, a first node, a second node and a first capacitor, wherein,
   a gate of the first thin film transistor is connected to the first clock signal input terminal, a source thereof is connected to the start signal input terminal, and a drain thereof is connected to the second node;

a gate of the second thin film transistor is connected to the second node, a source thereof is connected to the start signal input terminal and a drain thereof is connected to the first node;

the first node is for outputting the first turn-on voltage of the pre-charging circuit;

the second node is for outputting the second turn-on voltage of the pre-charging circuit; and one terminal of the first capacitor is connected to the second node and the other terminal thereof is connected to the output terminal of the shift register.

6. The shift register of claim 1, wherein the first pulling-up circuit comprises a third thin film transistor, a gate thereof is connected to the first node, a source thereof is connected to a high voltage, and a drain thereof is connected to the output terminal of the shift register.

7. The shift register of claim 1, wherein the pulling-down circuit comprises a fourth thin film transistor, a gate thereof is connected to the second node, a source thereof is connected to the second clock signal input terminal, and a drain thereof is connected to the output terminal of the shift register.

8. A gate driving circuit comprising a shift register, and the shift register comprises:

input terminals of the shift register, comprising a start signal input terminal, a first clock signal input terminal and a second clock signal input terminal;

a pre-charging circuit connected to the start signal input terminal to receive a start signal and connected to the first clock signal input terminal to receive a first clock signal, for outputting a first turn-on voltage and a second turn-on voltage in response to the first clock signal;

a first pulling-up circuit connected to a first turn-on voltage outputting terminal of the pre-charging circuit to receive the first turn-on voltage and connected to a external high voltage to receive the external high voltage, for outputting a high level in response to an enable level of the start signal and an enable level of the first clock signal under a control of the first turn-on voltage;

a pulling-down circuit connected to the second clock signal input terminal to receive a second clock signal and connected to a second turn-on voltage outputting terminal of the pre-charging circuit to receive the second turn-on voltage, for outputting a low level in response to a disable level of the start signal, a disable level of the first clock signal and an enable level of a second clock signal under a control of the second turn-on voltage;

a second pulling-up circuit connected to the second turn-on voltage outputting terminal of the pre-charging circuit to receive the second turn-on voltage and connected to the external high voltage to receive the external high voltage, for outputting the high level when the second turn-on voltage is at a disable level; and an output terminal of the shift register, connected to an output terminal of the first pulling-up circuit, an output terminal of the pulling-down circuit and an output terminal of the second pulling-up circuit, for outputting a voltage signal.

9. The gate driving circuit of claim 8, wherein the second pulling-up circuit comprises a reverse circuit and a pulling-up sub circuit, wherein, the reverse circuit outputs the high level when the second turn-on voltage is at the enable level, and outputs the low level when the second turn-on voltage is at the disable level; and the pulling-up sub circuit outputs the high level in response to the low level outputted from the reverse circuit.

10. The gate driving circuit of claim 9, wherein the reverse circuit comprises fifth to seventh thin film transistors and a third node, wherein, a gate of the fifth thin film transistor is connected to the second node, a source thereof is connected to the high voltage, and a drain thereof is connected to the third node;

a gate of the sixth thin film transistor is connected to a source of the seventh thin film transistor, a source thereof is connected to a low voltage and a drain thereof is connected to the third node;

a gate of the seventh thin film transistor is connected to the low voltage, the source thereof is connected to the gate of the sixth thin film transistor and a drain thereof is connected to the low voltage; and the third node is an output terminal of the reverse circuit.

11. The gate driving circuit of claim 9, wherein the pulling-up sub circuit comprises: an eighth thin film transistor, a gate thereof is connected to the third node, a source thereof is connected to the high voltage and a drain thereof is connected to the output terminal of the shift register.

12. The gate driving circuit of claim 8, wherein the pre-charging circuit comprises a first thin film transistor, a second thin film transistor, a first node, a second node and a first capacitor, wherein, a gate of the first thin film transistor is connected to the first clock signal input terminal, a source thereof is connected to the start signal input terminal, and a drain thereof is connected to the second node;

a gate of the second thin film transistor is connected to the second node, a source thereof is connected to the start signal input terminal and a drain thereof is connected to the first node;

the first node is for outputting the first turn-on voltage of the pre-charging circuit;

the second node is for outputting the second turn-on voltage of the pre-charging circuit; and one terminal of the first capacitor is connected to the second node and the other terminal thereof is connected to the output terminal of the shift register.

13. The gate driving circuit of claim 8, wherein the first pulling-up circuit comprises a third thin film transistor, a gate thereof is connected to the first node, a source thereof is connected to a high voltage, and a drain thereof is connected to the output terminal of the shift register.

14. The gate driving circuit of claim 8, wherein the pulling-down circuit comprises a fourth thin film transistor, a gate thereof is connected to the second node, a source thereof is connected to the second clock signal input terminal, and a drain thereof is connected to the output terminal of the shift register.

15. A display apparatus comprising a shift register on an array substrate, and the shift register comprises:

input terminals of the shift register, comprising a start signal input terminal, a first clock signal input terminal and a second clock signal input terminal;

a pre-charging circuit connected to the start signal input terminal to receive a start signal and connected to the first clock signal input terminal to receive a first clock signal, for outputting a first turn-on voltage and the second turn-on voltage in response to the start signal and a the first clock signal;

a first pulling-up circuit connected to a first turn-on voltage outputting terminal of the pre-charging circuit to receive the first turn-on voltage and connected to a external high voltage to receive the external high voltage, for outputting a high level in response to an enable level of the start signal and an enable level of the first clock signal under a control of the first turn-on voltage;

a pulling-down circuit connected to the second clock signal input terminal to receive a second clock signal and connected to a second turn-on voltage outputting terminal of the pre-charging circuit to receive the second turn-on voltage, for outputting a low level in response to a disable level of the start signal, a disable level of the first clock signal and an enable level of a second clock signal under a control of the second turn-on voltage;

a second pulling-up circuit connected to the second turn-on voltage outputting terminal of the pre-charging circuit to receive the second turn-on voltage and connected to the external high voltage to receive the external high voltage, for outputting the high level when the second turn-on voltage is at a disable level; and an output terminal of the shift register, connected to an output terminal of the first pulling-up circuit, an output terminal of the pulling-down circuit and an output terminal of the second pulling-up circuit, for outputting a voltage signal.

16. The display apparatus of claim 15, wherein the second pulling-up circuit comprises a reverse circuit and a pulling-up sub circuit, wherein, the reverse circuit outputs the high level when the second turn-on voltage is at the enable level, and outputs the low level when the second turn-on voltage is at the disable level; and the pulling-up sub circuit outputs the high level in response to the low level outputted from the reverse circuit.

17. The display apparatus of claim 16, wherein the reverse circuit comprises fifth to seventh thin film transistors and a third node, wherein, a gate of the fifth thin film transistor is connected to the second node, a source thereof is connected to the high voltage, and a drain thereof is connected to the third node;

a gate of the sixth thin film transistor is connected to a source of the seventh thin film transistor, a source thereof is connected to a low voltage and a drain thereof is connected to the third node;

a gate of the seventh thin film transistor is connected to the low voltage, the source thereof is connected to the gate of the sixth thin film transistor and a drain thereof is connected to the low voltage; and the third node is an output terminal of the reverse circuit.

18. The display apparatus of claim 15, wherein the pre-charging circuit comprises a first thin film transistor, a second thin film transistor, a first node, a second node and a first capacitor, wherein, a gate of the first thin film transistor is connected to the first clock signal input terminal, a source thereof is connected to the start signal input terminal, and a drain thereof is connected to the second node;

a gate of the second thin film transistor is connected to the second node, a source thereof is connected to the start signal input terminal and a drain thereof is connected to the first node;

the first node is for outputting the first turn-on voltage of the pre-charging circuit;

the second node is for outputting the second turn-on voltage of the pre-charging circuit;

and one terminal of the first capacitor is connected to the second node and the other terminal thereof is connected to the output terminal of the shift register.

19. The display apparatus of claim 15, wherein the first pulling-up circuit comprises a third thin film transistor, a gate thereof is connected to the first node, a source thereof is connected to a high voltage, and a drain thereof is connected to the output terminal of the shift register.

20. The display apparatus of claim 15, wherein the pulling-down circuit comprises a fourth thin film transistor, a gate thereof is connected to the second node, a source thereof is connected to the second clock signal input terminal, and a drain thereof is connected to the output terminal of the shift register.

* * * * *